United States Patent
Geprägs

(10) Patent No.: US 7,125,923 B2
(45) Date of Patent: Oct. 24, 2006

(54) FLAME RESISTANT THERMOPLASTIC MOLDING MATERIALS

(75) Inventor: Michael Geprägs, Weisenheim (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 100 days.

(21) Appl. No.: 10/482,649

(22) PCT Filed: Jul. 3, 2002

(86) PCT No.: PCT/EP02/07339

§ 371 (c)(1),
(2), (4) Date: Jan. 5, 2004

(87) PCT Pub. No.: WO03/064553

PCT Pub. Date: Jan. 16, 2003

(65) Prior Publication Data

US 2004/0209984 A1 Oct. 21, 2004

(30) Foreign Application Priority Data

Jul. 5, 2001 (DE) ................. 101 32 057

(51) Int. Cl.
C08K 3/22 (2006.01)
C08K 5/09 (2006.01)
C08K 5/11 (2006.01)

(52) U.S. Cl. ............ 524/310; 524/320; 524/321; 524/394; 524/398; 524/399; 524/400; 524/410; 524/411; 524/464

(58) Field of Classification Search ............ 524/310, 524/320–321, 394, 398–400, 410–411, 464
See application file for complete search history.

(56) References Cited

U.S. PATENT DOCUMENTS

| 3,953,539 A | 4/1976 | Kawase et al. |
| 4,061,810 A | 12/1977 | Minhas et al. |
| 4,532,290 A | 7/1985 | Jaquiss et al. |
| 4,857,673 A | 8/1989 | Wilkus et al. |
| 5,153,271 A | 10/1992 | Lawson et al. |
| 6,262,161 B1 * | 7/2001 | Betso et al. ............ 524/425 |
| 2004/0176510 A1 | 9/2004 | Geprägs ............ 542/409 |

FOREIGN PATENT DOCUMENTS

DE 197 53542 9/1999

OTHER PUBLICATIONS

XP 002216861.
Patent Abst. of Japan 55029542.
XP 002216862.

* cited by examiner

Primary Examiner—Peter Szekely
(74) Attorney, Agent, or Firm—Novak Druce & Quigg LLP

(57) ABSTRACT

The invention relates to thermoplastic moulding materials containing A) 10–98 wt. % of at least one thermoplastic polyester, B) 1–30 wt. % of a flame resistant material combination made of 100 wt. % B), $b_1$) 20 99 wt. % of a flame resistant material containing halogen $b_2$) 1–80 wt. % of an antimonoxide, C) 0.01–5 wt. % of tartaric acid or tartrates or a mixture thereof, D) 0 is 5 wt.-% of at least one stabilisator containing phosphorous, E) 0–70 wt.-% of additional materials, whereby the sum of the wt % of the components A)–E) is 100%.

10 Claims, No Drawings

FLAME RESISTANT THERMOPLASTIC MOLDING MATERIALS

The invention relates to thermoplastic molding compositions comprising
- A) from 10 to 98% by weight of at least one thermoplastic polyester
- B) from 1 to 30% by weight of a flame retardant combination made from, based on 100% by weight of B),
  - $b_1$) from 20 to 99% by weight of a halogen-containing flame retardant,
  - $b_2$) from 1 to 80% by weight of an antimony oxide
- C) from 0.01 to 5% by weight of tartaric acid or tartrates or mixtures of these
- D) from 0 to 5% by weight of at least one phosphorus-containing stabilizer
- E) from 0 to 70% by weight of other additives, where the total of the percentages by weight of components A) to E) is 100%.

The invention further relates to the use of the molding compositions of the invention for producing fibers, films, or moldings of any type.

U.S. Pat. No. 4,532,290 and U.S. Pat. No. 3,953,539 have disclosed PC/polyester blends which comprise phosphates as inhibitors for transesterification or as color stabilizers.

EP-A 543 128 has disclosed blends of this type which also may comprise halogenated polycarbonates, with transesterification inhibitors based on the dihydrogenphosphate of zinc or of calcium (these being known as acid phosphates).

There continues to be a technical problem in relation to the crystallization behavior and the flowability of molding compositions involving halogen-containing, in particular low-molecular-weight poly- or oligocarbonates, which can be used as flame retardants for polyesters.

The transesterification reaction between polycarbonate and polyester forms block copolymers which have broad molecular weight distribution and relatively poor crystallization behavior.

This is particularly apparent through the rapidly falling crystallization point, the result being an adverse effect on injection molding or blow molding processes.

DE-A 197 535 42 has moreover disclosed that low-molecular-weight halogen-free acids, such as citric acid, can be used as stabilizer for rubber-containing polyester/polycarbonate blends.

It is an object of the present invention, therefore, to provide flame-retardant polyester molding compositions which have better crystallization behavior during processing, and also have better flowability.

We have found that this object is achieved by means of the molding compositions defined at the outset. Preferred embodiments are given in the subclaims.

Surprisingly, this combination of in particular oligomeric, halogen-containing flame retardants with polyesters and tartaric acid or tartrates led to crystallization behavior in which a high crystallization point is retained over a prolonged period and on repeated melting. Associated with this is a shorter cycle time and shorter removal times, and also less tendency toward adhesion.

As component (A), the molding compositions of the invention comprise from 10 to 98% by weight, preferably from 10 to 97% by weight, and in particular from 30 to 80% by weight, of a thermoplastic polyester.

Use is generally made of polyesters A) based on aromatic dicarboxylic acids and on an aliphatic or aromatic dihydroxy compound.

A first group of preferred polyesters is that of polyalkylene terephthalates, in particular those having from 2 to 10 carbon atoms in the alcohol moiety.

Polyalkylene terephthalates of this type are known per se and are described in the literature. Their main chain contains an aromatic ring which derives from the aromatic dicarboxylic acid. There may also be substitution in the aromatic ring, e.g. by halogen, such as chlorine or bromine, or by $C_1$–$C_4$-alkyl, such as methyl, ethyl, iso- or n-propyl, or n-, iso- or tert-butyl.

These polyalkylene terephthalates may be prepared by reacting aromatic dicarboxylic acids, or their esters or other ester-forming derivatives, with aliphatic dihydroxy compounds in a manner known per se.

Preferred dicarboxylic acids are 2,6-naphthalenedicarboxylic acid, terephthalic acid and isophthalic acid, and mixtures of these. Up to 30 mol %, preferably not more than 10 mol %, of the aromatic dicarboxylic acids may be replaced by aliphatic or cycloaliphatic dicarboxylic acids, such as adipic acid, azelaic acid, sebacic acid, dodecanedioic acids and cyclohexanedicarboxylic acids.

Preferred aliphatic dihydroxy compounds are diols having from 2 to 6 carbon atoms, in particular 1,2-ethanediol, 1,3-propanediol, 1,4-butanediol, 1,6-hexanediol, 1,4-hexanediol, 1,4-cyclohexanediol, 1,4-cyclohexanedimethanol and neopentyl glycol, and mixtures of these.

Particularly preferred polyesters. (A) are polyalkylene terephthalates derived from alkanediols having from 2 to 6 carbon atoms. Among these, particular preference is given to polyethylene terephthalate, polypropylene terephthalate and polybutylene terephthalate, and mixtures of these. Preference is also given to PET and/or PBT which comprise, as other monomer units, up to 1% by weight, preferably up to 0.75% by weight, of 1,6-hexanediol and/or 2-methyl-1,5-pentanediol.

The viscosity number of the polyesters (A) is generally in the range from 50 to 220, preferably from 80 to 160 (measured in 0.5% strength by weight solution in a phenol/o-dichlorobenzene mixture in a weight ratio of 1:1 at 25° C.) in accordance with ISO 1628.

Particular preference is given to polyesters whose carboxyl end group content is up to 100 mval/kg of polyester, preferably up to 50 mval/kg of polyester and in particular up to 40 mval/kg of polyester. Polyesters of this type may be prepared, for example, by the process of DE-A 44 01 055. The carboxyl end group content is usually determined by titration methods (e.g. potentiometry).

Particularly preferred molding compositions comprise, as component A), a mixture of polyesters other than PBT, for example polyethylene terephthalate (PET). The proportion of the polyethylene terephthalate, for example, in the mixture is preferably up to 50% by weight, in particular from 10 to 35% by weight, based on 100% by weight of A).

It is also advantageous to use recycled PET materials (also termed scrap PET) in a mixture with polyalkylene terephthalates, such as PBT.

Recycled materials are generally:
1) those known as post-industrial recycled materials: these are production wastes during polycondensation or during processing, e.g. sprues from injection molding, start-up material from injection molding or extrusion, or edge trims from extruded sheets or films.
2) post-consumer recycled materials: these are plastic items which are collected and treated after utilization by the end consumer. Blow-molded PET bottles for mineral water, soft drinks and juices are easily the predominant items in terms of quantity.

Both types of recycled material may be used either as ground material or in the form of pellets. In the latter case, the crude recycled materials are isolated and purified and then melted and pelletized using an extruder. This usually facilitates handling and free flow, and metering for further steps in processing.

The recycled materials used may either be pelletized or in the form of regrind. The edge length should not be more than 6 mm, preferably less than 5 mm.

Because polyesters undergo hydrolytic cleavage during processing (due to traces of moisture) it is advisable to predry the recycled material. The residual moisture content after drying is preferably <0.2%, in particular <0.05%.

Another group to be mentioned is that of fully aromatic polyesters deriving from aromatic dicarboxylic acids and aromatic dihydroxy compounds.

Suitable aromatic dicarboxylic acids are the compounds previously mentioned for the polyalkylene terephthalates. The mixtures preferably used are made from 5 to 100 mol % of isophthalic acid and from 0 to 95 mol % of terephthalic acid, in particular from about 50 to about 80% of terephthalic acid and from 20 to about 50% of isophthalic acid.

The aromatic dihydroxy compounds preferably have the formula

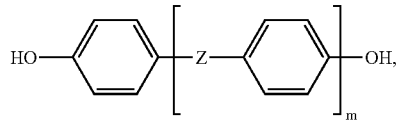

where Z is alkylene or cycloalkylene having up to 8 carbon atoms, arylene having up to 12 carbon atoms, carbonyl, sulfonyl, oxygen or sulfur, or a chemical bond, and m is from 0 to 2. The phenylene groups of the compounds may also have substitution by $C_1$–$C_6$-alkyl or alkoxy and fluorine, chlorine or bromine.

Examples of parent compounds for these compounds are
  dihydroxybiphenyl,
  di(hydroxyphenyl)alkane,
  di(hydroxyphenyl)cycloalkane,
  di(hydroxyphenyl) sulfide,
  di(hydroxyphenyl) ether,
  di(hydroxyphenyl) ketone,
  di(hydroxyphenyl) sulfoxide,
  α,α'-di(hydroxyphenyl)dialkylbenzene,
  di(hydroxyphenyl) sulfone, di(hydroxybenzoyl)benzene,
resorcinol, and
  hydroquinone, and also the ring-alkylated and ring-halogenated derivatives of these.

Among these, preference is given to
  4,4'-dihydroxybiphenyl,
  2,4-di(4'-hydroxyphenyl)-2-methylbutane,
  α,α'-di(4-hydroxyphenyl)-p-diisopropylbenzene,
  2,2-di(3'-methyl-4'-hydroxyphenyl)propane, and
  2,2-di(3'-chloro-4'-hydroxyphenyl)propane,
and in particular to
  2,2-di(4'-hydroxyphenyl)propane
  2,2-di(3',5-dichlorodihydroxyphenyl)propane,
  1,1-di(4'-hydroxyphenyl)cyclohexane,
  3,4'-dihydroxybenzophenone,
  4,4'-dihydroxydiphenyl sulfone and
  2,2-di(3',5'-dimethyl-4'-hydroxyphenyl)propane
and mixtures of these.

It is, of course, also possible to use mixtures of polyalkylene terephthalates and fully aromatic polyesters. These generally comprise from 20 to 98% by weight of the polyalkylene terephthalate and from 2 to 80% by weight of the fully aromatic polyester.

It is, of course, also possible to use polyester block copolymers, such as copolyetheresters. Products of this type are known per se and are described in the literature, e.g. in U.S. Pat. No. 3,651,014. Corresponding products are also available commercially, e.g. Hytrel® (DuPont).

According to the invention, polyesters include halogen-free polycarbonates. Examples of suitable halogen-free polycarbonates are those based on diphenols of the formula

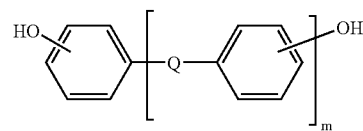

where Q is a single bond, $C_1$–$C_8$-alkylene, $C_2$–$C_3$-alkylidene, $C_3$–$C_6$-cycloalkylidene, $C_6$–$C_{12}$-arylene, or —O—, —S— or —SO$_2$—, and m is an integer from 0 to 2.

The phenylene radicals of the diphenols may also have substituents, such as $C_1$–$C_6$-alkyl or $C_1$–$C_6$-alkoxy.

Examples of preferred diphenols of the formula are hydroquinone, resorcinol, 4,4'-dihydroxybiphenyl, 2,2-bis(4-hydroxyphenyl)propane, 2,4-bis(4-hydroxyphenyl)-2-methylbutane and 1,1-bis(4-hydroxyphenyl)cyclohexane. Particular preference is given to 2,2-bis(4-hydroxyphenyl)propane and 1,1-bis(4-hydroxyphenyl)cyclohexane, and also to 1,1-bis(4-hydroxyphenyl)-3,3,5-trimethylcyclohexane.

Either homopolycarbonates or copolycarbonates are suitable as component A, and preference is given to the copolycarbonates of bisphenol A, as well as to bisphenol A homopolymer.

Suitable polycarbonates may be branched in a known manner, specifically by incorporating 0.05 to 2.0 mol %, based on the total of the biphenols used, of at least trifunctional compounds, for example those having three or more phenolic OH groups.

Polycarbonates which have proven particularly suitable have relative viscosities $\eta_{rel}$ of from 1.10 to 1.50, in particular from 1.25 to 1.40. This corresponds to an average molar mass $M_W$ (weight-average) of from 10 000 to 200 000 g/mol, preferably from 20 000 to 80 000 g/mol.

The diphenols of the formula are known per se or can be prepared by known processes.

The polycarbonates may, for example, be prepared by reacting the diphenols with phosgene in the interfacial process, or with phosgene in the homogeneous-phase process (known as the pyridine process), and in each case the desired molecular weight may be achieved in a known manner by using an appropriate amount of known chain terminators. (In relation to polydiorganosiloxane-containing polycarbonates see, for example, DE-A 33 34 782).

Examples of suitable chain terminators are phenol, p-tert-butylphenol, or else long-chain alkylphenols, such as 4-(1,3-tetramethylbutyl)phenol as in DE-A 28 42 005, or monoalkylphenols, or dialkylphenols with a total of from 8 to 20 carbon atoms in the alkyl substituents as in DE-A 35 06 472, such as p-nonylphenyl, 3,5-di-tert-butylphenol, p-tert-octylphenol, p-dodecylphenol, 2-(3,5-dimethylheptyl) phenol and 4-(3,5-dimethylheptyl)phenol.

For the purposes of the present invention, halogen-free polycarbonates are polycarbonates made from halogen-free biphenols, from halogen-free chain terminators and, if used, halogen-free branching agents, where the content of subordinate amounts at the ppm level of hydrolyzable chlorine, resulting, for example, from the preparation of the polycarbonates with phosgene in the interfacial process, is not regarded as meriting the term halogen-containing for the purposes of the invention. Polycarbonates of this type with contents of hydrolyzable chlorine at the ppm level are halogen-free polycarbonates for the purposes of the present invention.

Other suitable components A) which may be mentioned are amorphous polyester carbonates, where during the preparation process phosgene has been replaced by aromatic dicarboxylic acid units, such as isophthalic acid and/or terephthalic acid units. Reference may be made at this point to EP-A 711 810 for further details.

EP-A 365 916 describes other suitable copolycarbonates having cycloalkyl radicals as monomer units.

It is also possible for bisphenol A to be replaced by bisphenol TMC. Polycarbonates of this type are obtainable from Bayer with the trademark APEC HT®.

As component B), the molding compositions of the invention comprise from 1 to 30% by weight, preferably from 2 to 25% by weight, and in particular from 5 to 20% by weight, of a flame retardant combination made from $b_1$) from 20 to 99% by weight, preferably from 50 to 85% by weight, of a halogen-containing flame retardant, preferably with a degree of polymerization or degree of oligomerization >3, preferably >4

$b_2$) from 1 to 80% by weight, preferably from 15 to 50% by weight, of an antimony oxide.

Preferred oxides $b_2$) are antimony trioxide and antimony pentoxide. To improve dispersion, the oxide $b_2$) may be incorporated in what are known as masterbatches (concentrates) into the polymer A). The thermoplastics used in this concentrate may be identical with component A) or differ from the particular component A) used. Preference is given to concentrates of $b_2$) in polyolefins, preferably polyethylene.

Preferred suitable flame retardants $b_1$) are brominated compounds, such as brominated oligocarbonates (BC 52 or BC 58 from the company Great Lakes, or FG 7000 from the company Teijin Chem.) of the structural formula:

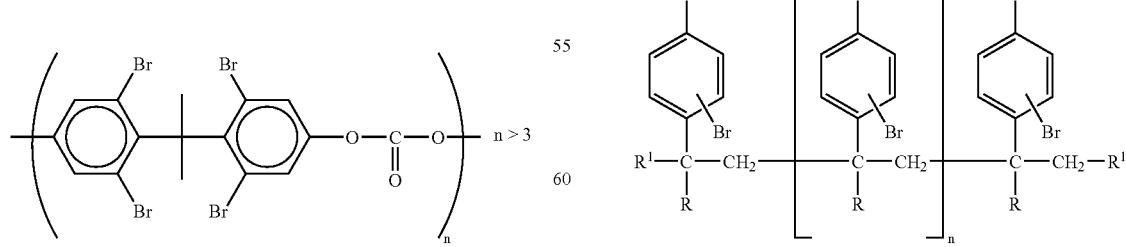

Other suitable compounds are polypentabromobenzyl acrylates having n>4 (e.g. FR 1025 from the company Dead Sea Bromine (DSB)) of the formula:

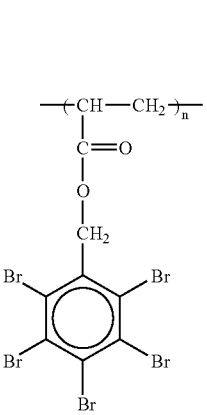

Other preferred brominated compounds are oligomeric reaction products (n>3) made from tetrabromo bisphenol A with epoxides (e.g. FR 2300 and 2400 from the company DSB) of the formula:

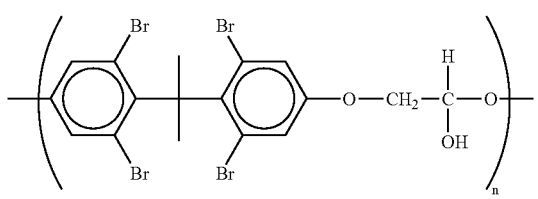

The brominated oligostyrenes preferably used as flame retardants have an average degree of polymerization (number average) of from 4 to 90, preferably from 5 to 60, measured by vapor pressure osmometry in toluene. Cyclic oligomers are likewise suitable. In one preferred embodiment of the invention, the brominated oligomeric styrenes to be used have the formula I below, where R is hydrogen or an aliphatic radical, in particular alkyl, e.g. $CH_2$ or $C_2H_5$, and n is the number of repeat units in the chain. R' may be either H or bromine, or else a fragment of a conventional free-radical generator:

(I)

n may be from 4 to 88, preferably from 4 to 58. The brominated oligostyrenes contain from 40 to 80% by weight, preferably from 55 to 70% by weight, of bromine. Preference is given to a product which is predominantly composed of polydibromostyrene. The substances can be melted without decomposition and are soluble in tetrahydrofuran, for example. They may be prepared either by ring bromination of—if desired aliphatically hydrogenated—styrene oligomers, as obtained, for example, by thermal polymerization of styrene (as in DE-A 25 37 385) or by free-radical oligomerization of suitable brominated styrenes. The flame retardant may also be prepared by ionic oligomerization of styrene followed by bromination. The amount of brominated oligostyrene needed to provide flame retardancy to the polyesters depends on the bromine content. The bromine content in the molding compositions of the invention is from 2 to 20% by weight, preferably from 5 to 12% by weight.

The brominated polystyrenes of the invention are usually obtained from the process described in EP-A 47 549:

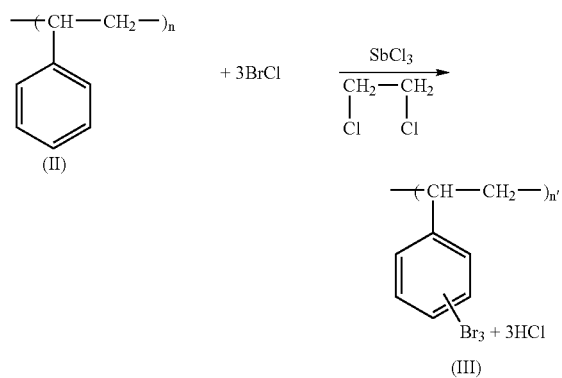

The brominated polystyrenes obtained from this process and available commercially are predominantly ring-substituted tribrominated products. n' (see III) is generally from 120 to 2 000, corresponding to a molecular weight of from 40 000 to 1 000 000, preferably from 130 000 to 800 000.

The bromine content (based on the content of ring-substituted bromine) is generally at least 55% by weight, preferably at least 60% by weight, and in particular 68% by weight.

The pulverulent products available commercially generally have a glass transition temperature of from 160 to 200° C., and are obtainable, for example, as HP 7010 from the company Albemarle or Pyrocheck® PB 68 from the company Ferro Corporation, or Saytex 7010 from the company Albemarle.

It is also possible to use mixtures of the brominated oligostyrenes with brominated polystyrenes in the molding compositions of the invention, and the mixing ratio here may be as desired.

The degree of polymerization may usually be determined by determining the molecular weight.

It corresponds to a molecular weight ($M_n$)>2 000, and this can generally be determined by membrane osmometry or by light scattering for $M_W$>10 000.

Chlorine-containing flame retardants $b_1$) are also suitable, and preference is given here to Dechlorane® plus from the company Oxychem.

As component C), the molding compositions of the invention comprise from 0.01 to 5% by weight, preferably from 0.05 to 2% by weight, and in particular from 0.05 to 1% by weight, of tartaric acid or tartrates, or a mixture of these. Tartaric acid is generally understood, as in Römpp Chemie-Lexikon, 1992, Georg Thieme Verlag, Stuttgart, 9th Edition, pp. 5025–5027, to be 2,3-dihydroxysuccinic acid, its molecular formula being

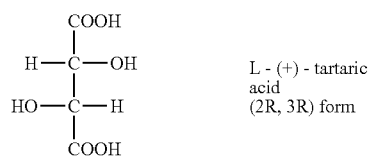

$C_4H_6O_6$, Mw 150.09. There are three stereoisomeric forms of tartaric acid: the L-(+) form [known as natural t.a. (2R, 3R) form, m.p. 169–170°, $D^{20}_4$ 1.7598], the D-(−) form [(2S, 3S) form, m.p. 169–170°, $D^{20}_4$ 1.7598] and the meso form [m.p. 159–160°, $D^{20}_4$ 1.666 (other data 1.737)]. Tartaric acid is a strong acid ($pK_{a1}$ 2.98, $pK_{a2}$ 4.34, other data: $pk_{a1}$ 2.93, $PK_{a2}$ 4.23, in each case at 25°).

The DL-(±) form of tartaric acid (racemic tartaric acid, uvic acid, (CAS [133-37-9], m.p. 205–206°)) does not occur in nature, but small amounts form during wine production and, together with meso-tartaric acid, when L-tartaric acid is heated in sodium hydroxide solution.

The L form occurs in many plants and fruits, in the free form and as the potassium, calcium, or magnesium salt, e.g. in grape juice to some extent as free tartaric acid and to some extent as potassium hydrogentartrate, which together with calcium tartrate precipitates in the form of cream of tartar once the wine has fermented. D-Tartaric acid, which is also termed non-natural tartaric acid, is very rare in nature. It is found in the leaves of the West African tree Bankinia reticulata.

Calcium chloride or calcium hydroxide is usually used to convert cream of tartar into calcium tartrate, which when treated with sulfuric acid releases tartaric acid and calcium sulfate. Tartaric acid is therefore a byproduct of winemaking. DL- or meso-tartaric acid is obtained on an industrial scale on oxidizing fumaric acid or maleic anhydride with hydrogen peroxide, potassium permanganate, or peracids, in the presence of tungstic acid. Small amounts of D-tartaric acid can be obtained from racemic tartaric acid using Penicillium glaucum, which degrades only L-tartaric acid.

According to Römpp (see above) p. 4457, tartrates are the esters or salts of tartaric acid. If only one hydrogen atom from the two carboxy groups has been replaced by organic radicals or metals, the result is generally what are known as the acid tartrates or hydrogentartrates (also termed bitartrates).

Preferred tartrates are the salts of tartaric acid, in particular those salts which are formed with the ions of alkaline earth metal or alkali metals.

Preferred salts which may be mentioned of alkaline earth metals or of alkali metals are tartar emetic (potassium antimony(III) oxide tartrate)

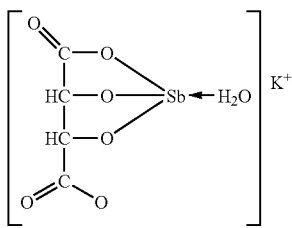

Cream of tartar (potassium hydrogentartrate), Rochelle salt (potassium sodium tartrate), sodium tartrate, sodium hydrogentartrate, and mixtures of these. Other suitable salts are potassium ammonium tartrate, sodium ammonium tartrate, and ammonium tartrate.

Suitable esters are those which can be derived from alcohols having from 1 to 10 carbon atoms, preferably with aliphatic alkyl groups.

As component D), the molding compositions of the invention may comprise from 0 to 5% by weight, preferably 0.1 to 5% by weight, and in particular from 0.1 to 2% by weight, of a phosphorus-containing stabilizer.

Preferred suitable stabilizers are organic phosphonites D) of the formula I

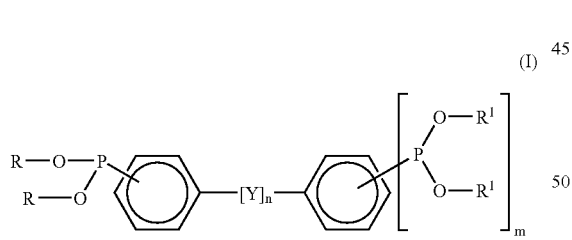

where
m is 0 or 1,
n is 0 or 1,
Y is an oxygen bridge, a sulfur bridge, or a 1,4-phenylene bridge, or a bridging unit of the formula —CH($R^2$)—; each of the R—C— and $R^1$—O— groups, independently of one another, is the radical of an aliphatic, alicyclic, or aromatic alcohol which may contain up to three hydroxyl groups, but excluding any arrangement of the hydroxyl groups which permits these to be part of a phosphorus-containing ring (termed monovalent R—O— groups), or, independently of one another in each case, two, R—O— or, respectively, $R^1$—O— groups bonded to a phosphorus atom are together the radical of an aliphatic, alicyclic, or aromatic alcohol having a total of up to three hydroxyl groups (termed bivalent R—O— or $R^1$—O— groups), $R^2$ is hydrogen, $C_1$–$C_8$-alkyl, or a group of the formula $COOR^3$, and $R^3$ is $C_{1-8}$-alkyl.

It is preferable for at least one R—O and at least one $R^1$—O group to be a phenol radical which bears a sterically hindered group, in particular a tert-butyl radical, in the 2-position.

Particular preference is given to tetrakis(2,4-di-tert-butylphenyl) biphenylenediphosphonite, which is available commercially from the company Ciba Spezialitätenchemie GmbH as Irgafos® PEPQ:

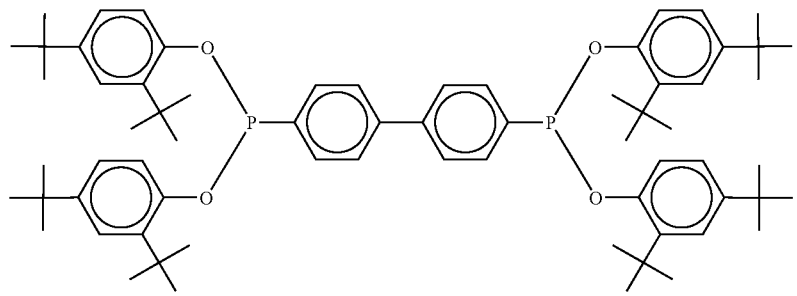

If R—O— and $R^1$—O— are divalent radicals, they preferably derive from di- or trihydric alcohols.

R and $R^1$ are preferably identical and are alkyl, aralkyl (preferably unsubstituted or substituted phenyl or phenylene), aryl (preferably unsubstituted or substituted phenyl) or a group of the formula α

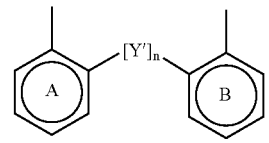

(α)

where the rings A and B may bear other substituents and

Y' is an oxygen bridge or a sulfur bridge, or a bridging unit of the formula —CH($R^3$)—, $R^2$ is hydrogen, $C_1$–$C_8$-alkyl, or a group of the formula —$COOR^3$, and $R^3$ is $C_{1-8}$-alkyl, and n is 0 or 1 (termed divalent R').

Particularly preferred radicals R are the radicals R", where this is $C_{1-22}$-alkyl, or phenyl which may bear from 1 to 3 substituents selected from the group consisting of cyano, $C_{1-22}$-alkyl, $C_{1-22}$-alkoxy, benzyl, phenyl, 2,2,6,6-tetramethylpiperid-4-yl, hydroxyl, $C_{1-8}$-alkylphenyl, carboxy, —C(CH$_3$)$_2$—C$_6$H$_5$, —COO—$C_{1-22}$-alkyl, CH$_2$CH$_{12}$—COOH, —CH$_2$CH$_2$COO—, $C_{1-22}$-alkyl or —CH$_2$—S—$C_{1-22}$-alkyl; or are a group of the formulae i-vii

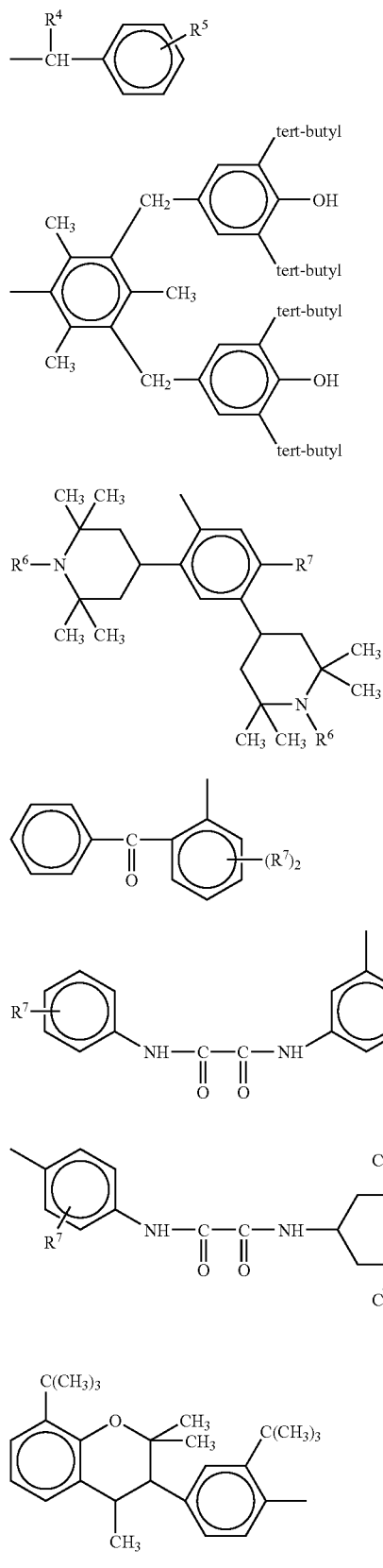

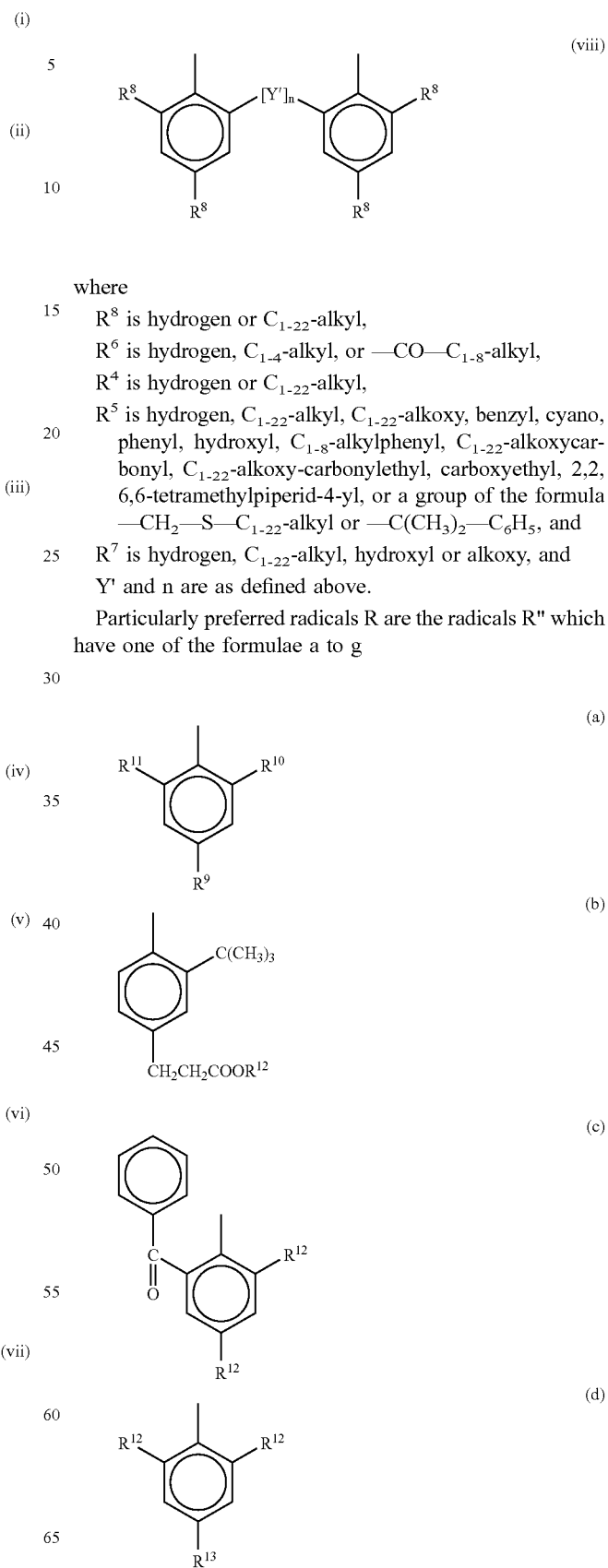

or two radicals R" together are a group of the formula viii where
R$^8$ is hydrogen or C$_{1-22}$-alkyl,
R$^6$ is hydrogen, C$_{1-4}$-alkyl, or —CO—C$_{1-8}$-alkyl,
R$^4$ is hydrogen or C$_{1-22}$-alkyl,
R$^5$ is hydrogen, C$_{1-22}$-alkyl, C$_{1-22}$-alkoxy, benzyl, cyano, phenyl, hydroxyl, C$_{1-8}$-alkylphenyl, C$_{1-22}$-alkoxycarbonyl, C$_{1-22}$-alkoxy-carbonylethyl, carboxyethyl, 2,2,6,6-tetramethylpiperid-4-yl, or a group of the formula —CH$_2$—S—C$_{1-22}$-alkyl or —C(CH$_3$)$_2$—C$_6$H$_5$, and
R$^7$ is hydrogen, C$_{1-22}$-alkyl, hydroxyl or alkoxy, and
Y' and n are as defined above.

Particularly preferred radicals R are the radicals R" which have one of the formulae a to g -continued (e)
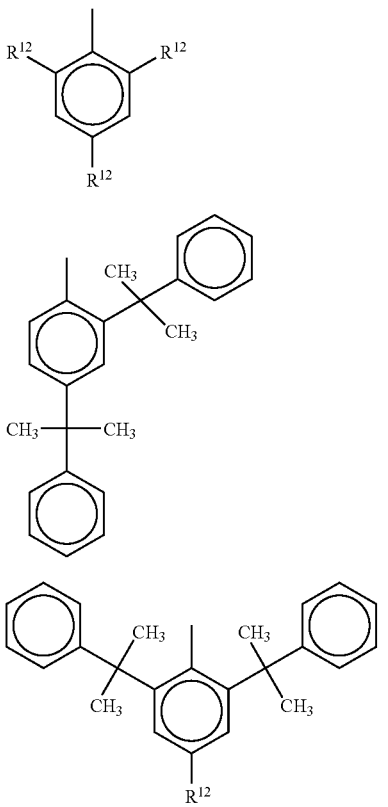

(f)

(g)

where
- R⁹ is hydrogen, $C_{1-8}$-alkyl, $C_{1-8}$-alkoxy, phenyl, $C_{1-8}$-alkylphenyl, or phenyl-$C_{1-8}$-alkylphenyl, or phenyl-$C_{1-4}$-alkyl,
- R¹⁰ and R¹¹, independently of one another, are hydrogen, $C_{1-22}$-alkyl, phenyl or $C_{1-8}$-alkylphenyl,
- R¹² is hydrogen or $C_{1-8}$-alkyl, and
- R¹³ is cyano, carboxyl or $C_{1-8}$-alkoxycarbonyl.

Among the groups of formula a, preference is given to 2-tert-butylphenyl, 2-phenylphenyl, 2-(1',1'-dimethylpropyl)phenyl, 2-cyclohexylphenyl, 2-tert-butyl-4-methylphenyl, 2,4-di-tert-amylphenyl, 2,4-di-tert-butylphenyl, 2,4-diphenylphenyl, 2,4-di-tert-octylphenyl, 2-tert-butyl-4-phenylphenyl, 2,4-bis(1',1'-dimethylpropyl)phenyl, 2-(1'-phenyl-1'-methyl-ethyl)phenyl, 2,4-bis(1'-phenyl-1'-methylethyl)phenyl, and 2,4-di-tert-butyl-6-methylphenyl.

Process for preparing the phosphonites D) are found in DE-A 40 01 397, and the amounts of these which may be present in the molding compositions are from 0.001 to 5% by weight, preferably from 0.01 to 3% by weight.

Other preferred stabilizers which may be mentioned are organic phosphites of the formula II:

(II)
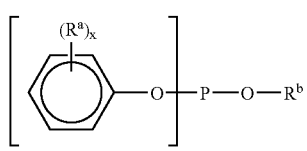

where
- X is from 1 to 5
- $R^a$ is an aliphatic radical having from 1 to 10 carbon atoms
- $R^b$ is an aliphatic radical having from 1 to 30 carbon atoms, or an unsubstituted or substituted aromatic radical having from 1 to 20 carbon atoms.

Preferred compounds are
Irgafos® 168 CAS No. 31570-04-4

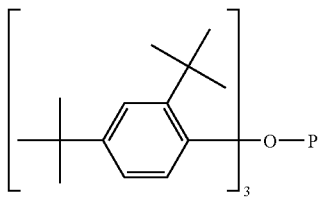

Irgafos® DDPP CAS No. 26544-23-0

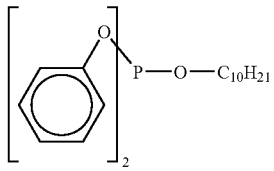

and
Irgafos® TPP CAS No. 101-02-0

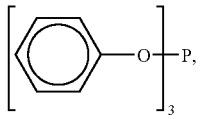

particular preference being given to
Irgafos® TNPP CAS No. 26523-78-4

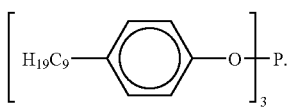

Other preferred stabilizers which may be mentioned are inorganic basic phosphates, such as the phosphates of alkaline earth metals or of alkali metals, and mixtures of these. Particular mention may be made of zinc phosphate, lithium phosphate, sodium phosphate, potassium phosphate, Al phosphate, gallium phosphate, and antimony phosphate.

It is, of course, also possible to use mixtures of the abovementioned stabilizers D).

As component E), the molding compositions of the invention may comprise from 0 to 70% by weight, preferably up to 50% by weight, of other additives.

As component E), the molding compositions of the invention may comprise from 0 to 5% by weight, in particular from 0.01 to 5% by weight, preferably from 0.05 to 3% by weight, and in particular from 0.1 to 2% by weight, of at least one ester or amide of saturated or unsaturated aliphatic carboxylic acids having from 10 to 40 carbon atoms, preferably from 16 to 22 carbon atoms, with saturated aliphatic alcohols or amines having from 2 to 40 carbon atoms, preferably from 2 to 6 carbon atoms.

The carboxylic acids may be mono- or dibasic. Examples which may be mentioned are pelargonic acid, palmitic acid, lauric acid, margaric acid, dodecanedioic acid, behenic acid and particularly preferably stearic acid, capric acid and also montanic acid (a mixture of fatty acids having from 30 to 40 carbon atoms).

The aliphatic alcohols may be mono- to tetrahydric. Examples of alcohols are n-butanol, n-octanol, stearyl alcohol, ethylene glycol, propylene glycol, neopentyl glycol, and pentaerythritol. Glycerol and pentaerythritol are preferred.

The aliphatic amines may be mono- to tribasic. Examples of these are stearylamine, ethyldiamine, propylenediamine, hexamethylene-diamine, and di(6-aminohexyl)amine. Ethylenediamine and hexamethylenediamine are particularly preferred.

Preferred esters and amides are therefore glycerol distearate, glycerol tristearate, ethylenediamine distearate, glycerol monopalmitate, glycerol trilaurate, glycerol monobehenate, and pentaerythritol tetrastearate.

It is also possible to use mixtures of different esters or amides, or combinations of esters with amides. The mixing ratio may be as desired.

Examples of other additives E) used in amounts of up to 40% by weight, preferably up to 30% by weight, are elastomeric polymers (also often termed impact modifiers, elastomers, or rubbers).

These are very generally copolymers which have preferably been built up from at least two of the following monomers: ethylene, propylene, butadiene, isobutene, isoprene, chloroprene, vinyl acetate, styrene, acrylonitrile and acrylates and/or methacrylates having from 1 to 18 carbon atoms in the alcohol component.

Polymers of this type are described, for example, in Houben-Weyl, Methoden der organischen Chemie, Vol. 14/1 (Georg-Thieme-Verlag, Stuttgart, Germany, 1961), pages 392–406, and in the monograph by C. B. Bucknall, "Toughened Plastics" (Applied Science Publishers, London, 1977).

Some preferred types of such elastomers are described below.

Preferred types of such elastomers are those known as ethylene-propylene (EPM) and ethylene-propylene-diene (EPDM) rubbers.

EPM rubbers generally have practically no residual double bonds, whereas EPDM rubbers may have from 1 to 20 double bonds per 100 carbon atoms.

Examples which may be mentioned of diene monomers for EPDM rubbers are conjugated dienes, such as isoprene and butadiene, non-conjugated dienes having from 5 to 25 carbon atoms, such as 1,4-pentadiene, 1,4-hexadiene, 1,5-hexadiene, 2,5-dimethyl-1,5-hexadiene and 1,4-octadiene, cyclic dienes, such as cyclopentadiene, cyclohexadienes, cyclooctadienes and dicyclopentadiene, and also alkenyl-norbornenes, such as 5-ethylidene-2-norbornene, 5-butylidene-2-norbornene, 2-methallyl-5-norbornene and 2-isopropenyl-5-norbornene, and tricyclodienes, such as 3-methyltricyclo-[5.2.1.0$^{2,6}$]-3,8-decadiene, and mixtures of these. Preference is given to 1,5-hexadiene, 5-ethylidenenorbornene and dicyclopentadiene. The diene content of the EPDM rubbers is preferably from 0.5 to 50% by weight, in particular from 1 to 8% by weight, based on the total weight of the rubber.

EPM and EPDM rubbers may preferably also have been grafted with reactive carboxylic acids or with derivatives of these. Examples of these are acrylic acid, methacrylic acid and derivatives thereof, e.g. glycidyl (meth)acrylate, and also maleic anhydride.

Copolymers of ethylene with acrylic acid and/or methacrylic acid and/or with the esters of these acids are another group of preferred rubbers. The rubbers may also include dicarboxylic acids-, such as maleic acid and fumaric acid, or derivatives of these acids, e.g. esters and anhydrides, and/or monomers containing epoxy groups. These monomers containing dicarboxylic acid derivatives or containing epoxy groups are preferably incorporated into the rubber by adding to the monomer mixture monomers containing dicarboxylic acid groups and/or epoxy groups and having the formula. I, II, III or IV

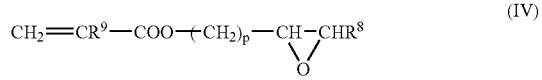

where $R^1$ to $R^9$ are hydrogen or alkyl having from 1 to 6 carbon atoms, and m is an integer from 0 to 20, g is an integer from 0 to 10 and p is an integer from 0 to 5.

$R^1$ to $R^9$ are preferably hydrogen, where m is 0 or 1 and g is 1. The corresponding compounds are maleic acid, fumaric acid, maleic anhydride, allyl glycidyl ether and vinyl glycidyl ether.

Preferred compounds of the formulae I, II and IV are maleic acid, maleic anhydride and (meth)acrylates containing epoxy groups, such as glycidyl acrylate and glycidyl methacrylate, and the esters with tertiary alcohols, such as tert-butyl acrylate. Although the latter have no free carboxyl groups, their behavior approximates to that of the free acids and they are therefore termed monomers with latent carboxyl groups.

The copolymers are advantageously composed of from 50 to 98% by weight of ethylene, from 0.1 to 20% by weight of monomers containing epoxy groups and/or methacrylic acid and/or monomers containing anhydride groups, the remaining amount being (meth)acrylates.

Particular preference is given to copolymers made from
from 50 to 98% by weight, in particular from 55 to 95% by weight of ethylene,
from 0.1 to 40% by weight, in particular from 0.3 to 20% by weight, of glycidyl acrylate and/or glycidyl methacrylate, (meth)acrylic acid and/or maleic anhydride, and
from 1 to 45% by weight, in particular from 10 to 40% by weight, of n-butyl acrylate and/or 2-ethylhexyl acrylate.

Other preferred (meth)acrylates are the methyl, ethyl, propyl, isobutyl and tert-butyl esters.

Besides these, comonomers which may be used are vinyl esters and vinyl ethers.

The ethylene copolymers described above may be prepared by processes known per se, preferably by random copolymerization at high pressure and elevated temperature. Appropriate processes are well known.

Preferred elastomers also include emulsion polymers whose preparation is described, for example, by Blackley in the monograph "Emulsion Polymerization". The emulsifiers and catalysts which may be used are known per se.

In principle it is possible to use homogeneously structured elastomers or those with a shell structure. The shell-type structure is determined by the sequence of addition of the individual monomers. The morphology of the polymers is also affected by this sequence of addition.

Monomers which may be mentioned here, merely as examples, for the preparation of the rubber fraction of the elastomers are acrylates, such as n-butyl acrylate and 2-ethylhexyl acrylate, corresponding methacrylates, butadiene and isoprene, and also mixtures of these. These monomers may be copolymerized with other monomers, such as styrene, acrylonitrile, vinyl ethers and with other acrylates or methacrylates, such as methyl methacrylate, methyl acrylate, ethyl acrylate or propyl acrylate.

The soft or rubber phase (with a glass transition temperature of below 0° C.) of the elastomers may be the core, the outer envelope or an intermediate shell (in the case of elastomers whose structure has more than two shells). Elastomers having more than one shell may also have more than one shell made from a rubber phase.

If one or more hard components (with glass transition temperatures above 20° C.) are involved, besides the rubber phase, in the structure of the elastomer, these are generally prepared by polymerizing, as principal monomers, styrene, acrylonitrile, methacrylonitrile, α-methylstyrene, p-methylstyrene, or acrylates or methacrylates, such as methyl acrylate, ethyl acrylate or methyl methacrylate. Besides these, it is also possible to use relatively small proportions of other comonomers.

It has proven advantageous in some cases to use emulsion polymers which have reactive groups at their surfaces. Examples of groups of this type are epoxy, carboxyl, latent carboxyl, amino and amide groups, and also functional groups-which may be introduced by concomitant use of monomers of the formula

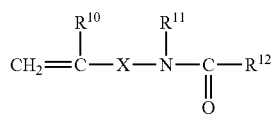

where:
R$^{10}$ is hydrogen or C$_1$–C$_4$-alkyl,
R$^{11}$ is hydrogen or C$_1$–C$_8$-alkyl or aryl, in particular phenyl,
R$^{12}$ is hydrogen, C$_1$–C$_{10}$-alkyl, C$_6$–C$_{12}$-aryl or —OR$^{13}$
R$^{13}$ is C$_1$–C$_8$-alkyl or C$_6$–C$_{12}$-aryl, if desired with substitution by O- or N-containing groups,
X is a chemical bond or C$_1$–C$_{10}$-alkylene or C$_6$–C$_{12}$-arylene, or

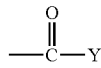

Y is O—Z or NH—Z, and
Z is C$_1$–C$_{10}$-alkylene or C$_6$–C$_{12}$-arylene.

The graft monomers described in EP-A 208 187 are also suitable for introducing reactive groups at the surface.

Other examples which may be-mentioned are acrylamide, methacrylamide and substituted acrylates or methacrylates, such as (N-tert-butylamino)ethyl methacrylate, (N,N-dimethylamino)ethyl acrylate, (N,N-dimethylamino)methyl acrylate and (N,N-diethylamino)ethyl acrylate.

The particles of the rubber phase may also have been crosslinked. Examples of crosslinking monomers are 1,3-butadiene, divinylbenzene, diallyl phthalate and dihydrodicyclopentadienyl acrylate, and also the compounds described in EP-A 50 265.

It is also possible to use the monomers known as graft-linking monomers, i.e. monomers having two or more polymerizable double bonds which react at different rates during the polymerization. Preference is given to the use of compounds of this type in which at least one reactive group polymerizes at about the same rate as the other monomers, while the other reactive group (or reactive groups), for example, polymerize(s) significantly more slowly. The different polymerization rates give rise to a certain proportion of unsaturated double bonds in the rubber. If another phase is then grafted onto a rubber of this type, at least some of the double bonds present in the rubber react with the graft monomers to form chemical bonds, i.e. the phase grafted on has at least some degree of chemical bonding to the graft base.

Examples of graft-linking monomers of this type are monomers containing allyl groups, in particular allyl esters of ethylenically unsaturated carboxylic acids, for example allyl acrylate, allyl methacrylate, diallyl maleate, diallyl fumarate and diallyl itaconate, and the corresponding monoallyl compounds of these dicarboxylic acids. Besides these there is a wide variety of other suitable graft-linking monomers. For further details reference may be made here, for example, to U.S. Pat. No. 4,148,846.

The proportion of these crosslinking monomers in the impact-modifying polymer is generally up to 5% by weight, preferably not more than 3% by weight, based on the impact-modifying polymer.

Instead of graft polymers whose structure has more than one shell, it is also possible to use homogeneous, i.e. single-shell, elastomers made from 1,3-butadiene, isoprene and n-butyl acrylate or from copolymers of these. These products, too, may be prepared by concomitant use of crosslinking monomers or of monomers having reactive groups.

Examples of preferred emulsion polymers are n-butyl acrylate-(meth)acrylic acid copolymers, n-butyl acrylate-glycidyl acrylate or n-butyl acrylate-glycidyl methacrylate copolymers, graft polymers with an inner core made from n-butyl acrylate or based on butadiene and with an outer envelope made from the abovementioned copolymers, and copolymers of ethylene with comonomers which supply reactive groups.

The elastomers described may also be prepared by other conventional processes, e.g. by suspension polymerization.

Preference is also given to silicone rubbers, as described in DE-A 37 25 576, EP-A 235 690, DE-A 38 00 603 and EP-A 319 290.

It is, of course, also possible to use mixtures of the types of rubber listed above.

Fibrous or particulate fillers (component E)) which may be mentioned are carbon fibers, glass fibers, glass beads, amorphous silica, asbestos, calcium silicate, calcium metasilicate, magnesium carbonate, kaolin, chalk, powdered quartz, mica, barium sulfate and feldspar, used in amounts of up to 50% by weight, in particular from 1 to 50% by weight, preferably from 5 to 40% by weight and in particular from 15 to 35% by weight.

Preferred fibrous fillers which may be mentioned are carbon fibers, aramid fibers and potassium titanate fibers, and particular preference is given to glass fibers in the form of E glass. These may be used as rovings or in the commercially available forms of chopped glass.

The fibrous fillers may have been surface-precoated with a silane compound to improve compatibility with the thermoplastic.

Suitable silane compounds have the formula:

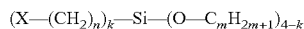

where:

X is $NH_2-$,

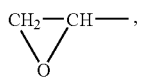

HO—, n is an integer from 2 to 10, preferably 3 to 4,
m is an integer from 1 to 5, preferably 1 to 2, and
k is an integer from 1 to 3, preferably 1.

Preferred silane compounds are aminopropyltrimethoxysilane, aminobutyltrimethoxysilane, aminopropyltriethoxysilane and aminobutyltriethoxysilane, and also the corresponding silanes which contain a glycidyl group as substituent X.

The amounts of the silane compounds generally used for surface-coating are from 0.05 to 5% by weight, preferably from 0.5 to 1.5% by weight and in particular from 0.8 to 1% by weight (based on E).

Acicular mineral fillers are also suitable.

For the purposes of the present invention, acicular mineral fillers are mineral fillers with strongly developed acicular character. An example is acicular wollastonite. The mineral preferably has an L/D (length to diameter) ratio of from 8:1 to 35:1, preferably from 8:1 to 11:1. The mineral filler may, if desired, have been pretreated with the abovementioned silane compounds, but the pretreatment is not essential.

Other fillers which may be mentioned are kaolin, calcined kaolin, wollastonite, talc and chalk.

Colorants which may be added are inorganic pigments, such as ultramarine blue, iron oxide, titanium dioxide, zinc sulfide, and carbon black, and also organic pigments, such as phthalocyanines, quinacridones and perylenes, and also dyes, such as nigrosine and anthraquinones.

Nucleating agents which may be used are sodium phenyl phosphinate, alumina, silica, and preferably talc.

Other lubricants and mold-release agents which are usually used in amounts of up to 1% by weight are preferably long-chain fatty acids (e.g. stearic acid or behenic acid), salts of these (e.g. calcium stearate or zinc stearate) or montan waxes (mixtures of straight-chain saturated carboxylic acids having chain lengths of from 28 to 32 carbon atoms) or their alkali metal and/or alkaline earth metal salts, preferably calcium montanate or sodium montanate, and also low-molecular-weight polyethylene waxes and low-molecular-weight polypropylene waxes.

Examples of plasticizers which may be mentioned are dioctyl phthalates, dibenzyl phthalates, butyl benzyl phthalates, hydrocarbon oils and N-(n-butyl)benzenesulfonamide.

The novel molding compositions may also comprise from 0 to 5% by weight, preferably from 0.1 to 3% by weight, of an antidrop agent, such as fluorine-containing ethylene polymers. These are polymers of ethylene with a fluorine content of from 55 to 76% by weight, preferably from 70 to 76% by weight.

Examples of these are polytetrafluoroethylene (PTFE), tetrafluoroethylene-hexafluoropropylene copolymers and tetrafluoroethylene copolymers with relatively small proportions (generally up to 50% by weight) of copolymerizable ethylenically unsaturated monomers. These are described, for example, by Schildknecht in "Vinyl and Related Polymers", Wiley-Verlag, 1952, pages 484–494 and by Wall in "Fluoropolymers" (Wiley Interscience, 1972).

These fluorine-containing ethylene polymers have homogeneous distribution in the molding compositions and preferably have a particle size $d_{50}$ (number average) in the range from 0.05 to 10 μm, in particular from 0.1 to 5 μm. These small particle sizes may particularly preferably be achieved by the use of aqueous dispersions of fluorine-containing ethylene polymers and the incorporation of these into a polyester melt.

The novel thermoplastic molding compositions may be prepared by methods known per se, by mixing the starting components in conventional mixing apparatuses, such as screw extruders, Brabender mixers or Banbury mixers, and then extruding them. The extrudate may be cooled and comminuted. It is also possible to premix individual components and then to add the remaining starting materials individually and/or likewise in a mixture. In one preferred embodiment, if component D) is present this may be premixed with component C) and/or, preferably at from room temperature to 180° C., applied to the pellets of A). It is also preferred to add a lubricant E) as soon as at least 80% of the desired final viscosity has been achieved in the preparation of component A). The mixing temperatures are generally from 230 to 290° C.

In one preferred method of operation, components B) and C) may be mixed with a polyester prepolymer, compounded, and pelletized. The resultant pellets are then condensed continuously or batchwise in the solid phase under an inert gas at a temperature below the melting point of component A) until the desired viscosity has been reached.

The thermoplastic molding compositions of the invention have good crystallization behavior and good flame retardancy. Processing takes place very substantially without any alteration to the polymer matrix (discoloration). The molding compositions also have good molecular weight stability during processing, short cycle times, and good demolding performance. They are suitable for producing fibers, films, or moldings, in particular for applications in the electrical or electronics sector. These applications are in particular lamp parts, such as lamp sockets and lamp holders, plugs and multipoint connectors, coil formers, casings for capacitors or contactors, and circuit breakers, relay housings, and reflectors.

Particular embodiments of applications of the molding composition are: a coil housing, a coil former, a coil carrier, a capacitor cup, a plug connector, a multipoint connector, a plug bridge, a chip carrier, a printed circuit board, a lamp part, a lamp holder, a starter housing, a transformer housing, a battery housing, a fan impeller, a housing for a fan impeller, a lamp socket, a protective covering for lamps, a lamp carrier, a lamp switch, a small electrical device, a housing for a clothes iron, a piece of switchgear, a power breaker, a charger, a plug socket, an engine component, a generator component, or a terminal strips.

EXAMPLES

Component $a_1$: Polybutylene terephthalate with a viscosity number of 130 ml/g and a carboxy end group content of 25 mval/kg (VN measured in 0.5% strength by weight solution made from phenol/o-dichlorobenzene, 1:1 mixture, at 25° C. to ISO 1628), comprising 0.65% by weight, based on a1, of pentaerythritol tetrastearate (component E1)

Component $a_2$: PET with a VN of 76 ml/g

Component $b_1$

Tetrabromobisphenol A oligocarbonate n ~4–5 (BC 52/58 from the company Great Lakes)

$M_n \approx 2500$

Component $b_2$

Antimony trioxide (as 90% strength concentrate in polyethylene)

Component C1

Potassium hydrogentartrate

Component C2

Tartaric acid (in powder form)

Component Cc (for comparison)

Citric acid-(powdered).

Component D1

Irgafos® TNPP from the company Ciba Geigy Spez. Chemie GmbH

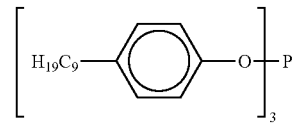

Component D2

Irgafos® PEPQ from the company Ciba Geigy Spez. Chemie GmbH

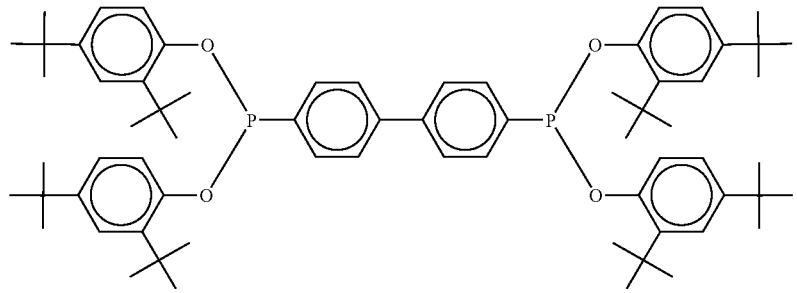

Component D3

$Li_3(PO_4)$

Component Dc $Zn(H_2PO_4)_2$

Component E2

Chopped glass fibers of average length 4 mm (epoxysilanized size)

Component E3

Polytetrafluoroethylene (Teflon) encapsulated with SAN (50:50) (Blendex® 449 from the company General Electric Plastics)

Preparation of Molding Compositions

Components A) to E) were mixed and homogenized in the quantitative ratios given in the table, in an extruder at 260° C., and pelletized and dried. Components C and D were premixed at RT.

The following DSC measurements were made
1) $TM_2$ was determined as follows
a) preconditioning for 3 min at 40° C.
b) heating at 20 k/min from 40° C. to 300° C.
c) holding at 300° C. for 1 min
d) cooling at 20 k/min from 300° C. to 40° C.
e) holding for 1 min at 40° C.
f) 2nd heating at 20 k/min from 40° C. to 300° C.
2) TCO was determined as follows:
a) procedure of points a–d as for $TM_2$
b) measurement of onset temperature at start of crystallization on the solidification exotherm
3) TCM was determined as follows:
a) procedure of points a–d as for $TM_2$
b) determination of temperature at the maximum of the crystallization exotherm The makeup of the molding compositions and the results of the measurements are found in the table.

| Example | 1 | 1c | 2 | 3 | 4 | 5 | 2c | 3c | 6 | 7 | 8 |
|---|---|---|---|---|---|---|---|---|---|---|---|
| Makeup [% by wt.] a1 + E1 | 36.2 + 0.5 | 36.3 + 0.5 | 36 + 0.5 | 35.7 + 0.5 | 35.3 + 0.5 | 36.1 + 0.5 | 36.1 + 0.5 | 36.3 + 0.5 | 35.9 + 0.5 | 36.25 + 0.5 | 36.2 + 0.5 |
| a2 | 15 | 15 | 15 | 15 | 15 | 15 | 15 | 15 | 15 | 15 | 15 |
| b1 | 12 | 12 | 12 | 12 | 12 | 12 | 12 | 12 | 12 | 12 | 12 |
| b2 | 5.5 | 5.5 | 5.5 | 5.5 | 5.5 | 5.5 | 5.5 | 5.5 | 5.5 | 5.5 | 5.5 |
| C | 0.3 C1 | 0.2 Cc | 0.5 C1 | 0.2 C2 | 0.2 C2 | 0.2 C2 | 0.4 Cc | — | 0.1 C2 | 0.25 C2 | 0.15 C2 |
| D | — | — | — | 0.6 D1 | 1 D2 | 0.2 D3 | — | 0.2 Dc | 0.5 D2 | — | 0.15 D3 |
| E2 | 30 | 30 | 30 | 30 | 30 | 30 | 30 | 30 | 30 | 30 | 30 |
| E3 | 0.5 | 0.5 | 0.5 | 0.5 | 0.5 | 0.5 | 0.5 | 0.5 | 0.5 | 0.5 | 0.5 |
| $TM_2$ [° C.] | 201 | 195.8 | 198 | 195 | 196 | 196 | 192 | 195 | 200 | 195 | 201 |
| Tco [° C.] | 185 | 179 | 182 | 178 | 178 | 176 | 174 | 177 | 181 | 178 | 183 |
| TCM [° C.] | 167.4 | 163.4 | 167 | 163 | 163 | 163 | 158 | 162 | 168 | 163 | 166 |

We claim:

1. A thermoplastic molding composition comprising
   A) from 10 to 98% by weight of at least one thermoplastic polyester
   B) from 1 to 30% by weight of a flame retardant combination made from, based on 100% by weight of B),
      $b_1$) from 20 to 99% by weight of a halogen-containing flame retardant,
      $b_2$) from 1 to 80% by weight of an antimony trioxide or antimony pentoxide
   C) from 0.01 to 5% by weight of tartaric acid or tartrates or mixtures of these
   D) from 0 to 5% by weight of at least one phosphorus-containing stabilizer
   E) from 0 to 70% by weight of one or more other additives selected from the group consisting of esters of saturated and of unsaturated aliphatic carboxylic acids with saturated aliphatic alcohols, amides of saturated and of unsaturated aliphatic carboxylic acids with saturated aliphatic amines, elastomeric polymers, fibrous and particulate fillers, colorants, lubricants, mold release agents, plasticizers and antidrop agents, where the total of the percentages by weight of components A) to E) is 100%.

2. A thermoplastic molding composition as claimed in claim 1 comprising
   from 10 to 98% by weight of A)
   from 1 to 30% by weight of B)
   from 0.01 to 5% by weight of C)
   from 0.1 to 5% by weight of D).

3. A thermoplastic molding composition as claimed in claim 1, in which component D) is composed of an organic phosphonite or organic phosphite or of an inorganic basic phosphate or of a mixture of these.

4. A thermoplastic molding composition as claimed in claim 1, in which component D) is composed of an organic phosphonite of the formula (I):

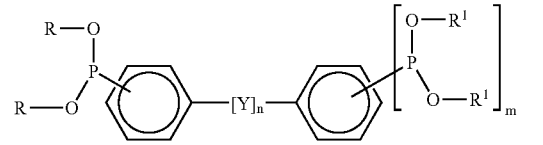

where
m is 0 or 1,
n is 0 or 1,
Y is an oxygen-sulfur bridge, a sulfur bridge, or a 1,4-phenylene bridge, or a bridging unit of the formula —CH($R^2$)—;
each of the R—O— and $R^1$—O— groups, independently of one another, is the radical of an aliphatic, alicyclic, or aromatic alcohol which may contain up to three hydroxyl groups, but excluding any arrangement of the hydroxyl groups which permits these to be part of a phosphorus-containing ring (termed monovalent R—O— groups), or, independently of one another in each case, two, R—O— or, respectively, $R^1$ groups bonded to a phosphorus atom are together the radical of an aliphatic, alicyclic, or aromatic alcohol having a total of up to three hydroxyl groups (termed bivalent R—O— or $R^1$—O— groups), $R^2$ is hydrogen, $C_1$–$C_8$-alkyl, or a group of the formula $COOR^3$, and $R^3$ is $C_{1-8}$-alkyl.

5. A thermoplastic molding composition as claimed in claim 1, in which component D) is composed of an organic phosphite of has the formula (II):

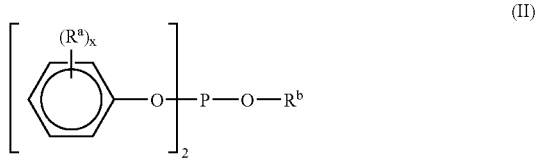

where
x is from 1 to 5
$R^a$ is an aliphatic radical having from 1 to 10 carbon atoms
$R^b$ is an aliphatic radical having from 1 to 30 carbon atoms, or an unsubstituted or substituted aromatic radical having from 1 to 20 carbon atoms.

6. A thermoplastic molding composition as claimed in claim 3 in which the inorganic basic phosphate D) is composed of zinc phosphate, aluminum phosphate, gallium phosphate, antimony phosphate, alkaline earth metal phosphates, or alkali metal phosphates, or a mixture of these.

7. A thermoplastic molding composition as claimed in claim 1, comprising, as component C), alkali metal tartrates or alkaline earth metal tartrates, or esters of tartaric acid, or a mixture of these.

8. A thermoplastic molding composition as claimed in claim 1, in which component C is composed of potassium tartrates, potassium hydrogen tartrates, potassium sodium tartrates, sodium tartrates, sodium hydrogen tartrates, or a mixture of these.

9. A molding of any type, obtained from the thermoplastic molding compositions as claimed in claim 1.

10. A coil housing, a coil former, a coil carrier, a capacitor cup, a plug connector, a multipoint connector, a plug bridge, a chip carrier, a printed circuit board, a lamp part, a lamp holder, a starter housing, a transformer housing, a battery housing, a fan impeller, a housing for a fan impeller, a lamp socket, a protective covering for lamps, a lamp carrier, a lamp switch, a small electrical device, a housing for a clothes iron, a piece of switchgear, a power breaker, a charger, a plug socket, an engine component, a generator component, or terminal strip made from the thermoplastic molding compositions as claimed in claim 1.

* * * * *

UNITED STATES PATENT AND TRADEMARK OFFICE
CERTIFICATE OF CORRECTION

PATENT NO. : 7,125,923 B2 Page 1 of 1
APPLICATION NO. : 10/482649
DATED : October 24, 2006
INVENTOR(S) : Geprags It is certified that error appears in the above-identified patent and that said Letters Patent is hereby corrected as shown below:

Claim 4, column 24, indicated line 59, "Y is an oxygen-sulfur bridge" should read --Y is an oxygen bridge,--

Claim 5, column 25, indicated line 11: "has" should be deleted.

Signed and Sealed this

Twenty-second Day of May, 2007

JON W. DUDAS
*Director of the United States Patent and Trademark Office*